United States Patent [19]

Pattany et al.

[11] Patent Number: 4,683,431

[45] Date of Patent: Jul. 28, 1987

[54] MAGNETIC RESONANCE IMAGING OF HIGH VELOCITY FLOWS

[75] Inventors: Pradip M. Pattany, Willoughby, Ohio; Graham L. Nayler, Oxon, United Kingdom

[73] Assignee: Picker International, Inc., Highland Hts., Ohio

[21] Appl. No.: 766,757

[22] Filed: Aug. 16, 1985

[51] Int. Cl.$^4$ ............................................. G01R 33/20
[52] U.S. Cl. .................................. 324/306; 324/309; 128/653
[58] Field of Search ............... 324/306, 307, 309, 312; 128/653

[56] References Cited

U.S. PATENT DOCUMENTS

| | | | |
|---|---|---|---|
| 4,431,968 | 2/1984 | Edelstein et al. | 324/309 |
| 4,516,075 | 5/1985 | Moran | 324/309 |
| 4,516,582 | 5/1985 | Redington | 324/309 X |
| 4,520,828 | 6/1985 | Burl et al. | 128/653 |
| 4,523,596 | 6/1985 | Macovski | 128/653 |
| 4,528,985 | 7/1985 | Macovski | 128/653 |
| 4,532,473 | 7/1985 | Wherli | 324/306 |
| 4,551,680 | 11/1985 | Macovski | 324/309 |
| 4,570,119 | 2/1986 | Wehrli et al. | 324/306 |
| 4,574,239 | 4/1986 | Singer | 324/306 |
| 4,595,879 | 6/1986 | Lent et al. | 324/309 |
| 4,602,641 | 7/1986 | Feinberg | 128/653 |

FOREIGN PATENT DOCUMENTS

| | | |
|---|---|---|
| 0115642 | 8/1984 | European Pat. Off. |
| 0142343 | 5/1985 | European Pat. Off. |
| 0145276 | 6/1985 | European Pat. Off. |
| 2127155 | 4/1984 | United Kingdom |

OTHER PUBLICATIONS

"NMR Blood Flow Imaging Using Multiecho, Phase Contrast Sequences" by M. O'Donnell, Med. Phys. 12(1), Jan./Feb. 1985, pp. 59–64.
"Physics Abstracts", ISSN 0036-8091, Science Abstracts Series A, Jan. 2nd, 1985, Abstracts 1–4906.
P. R. Moran, "A Flow Velocity Zeumatographic Interlace for NMR Imaging in Humans", Mag. Res. Imag., vol. 1, pp. 197–203 (1982).
D. J. Bryant et al., "Measurement of Flow with NMR Imaging using A . . . Difference Technique", JCAT, 8(4):588–593 (1984).

T. W. Redpath, et al., "A New Method or NMR Flow Imaging", Phys. Med. Biol, 29(7):891–898 (1984).
K. J. Packer, "The Study of Slow Coherent Molecular Motion by Pulsed NMR", Molecular Phys, 17(4):355–368 (1969).
V. Waluch et al., "NMR Even Echo Rephasing in Slow Laminar Flow", JCAT, 8(4):594–598 (1984).
W. G. Bradley et al., "Blood Flow: Magnetic Resonance Imaging", Radiology, 154:443–450 (1985).
R. J. Hayward et al., "Pulsed Field Gradient Spin Echo NMR Studies of Flow in Fluids", Molecular Phys, 23(6):1083–1102 (1972).

*Primary Examiner*—Stewart J. Levy
*Assistant Examiner*—Kevin D. O'Shea
*Attorney, Agent, or Firm*—Fay, Sharpe, Beall, Fagan, Minnich & McKee

[57] ABSTRACT

A main magnetic field coil and control cause a generally uniform main magnetic field through an image region. A resonance excitation control causes an R.F. coil to generate excitation pulses. An inversion pulse control causes the R.F. coil to generate a first 180 degree inversion pulse after the excitation pulse and a second 180 degree inversion pulse immediately preceding the excitation pulse. A slice gradient control and a read gradient control cause a gradient coil to generate complimentary slice selection gradients and complimentary read gradient profiles on either side of the first inversion pulse in such a manner that the effective first moment in time is substantially zero. By time shifting one or both of the slice selection and read gradients, resonating nuclei in the selected slice can be phase encoded. A transform algorithm transforms resonance signals received by the R.F. coil into image representations. A first memory receives real and imaginary components of the image representations when the read and slice selection gradients are not shifted and a second memory real and imaginary components of receives the image representations when one or both of the read and slice selection gradients are time shifted. From the arctangent of the real and imaginary components, first and second phase maps are calculated for storage in first and second phase memories. The intensity of each pixel of the phase maps varies with phase shift, hence velocity. By subtracting the two phase maps, correction is made for any stationary artifacts.

22 Claims, 4 Drawing Figures

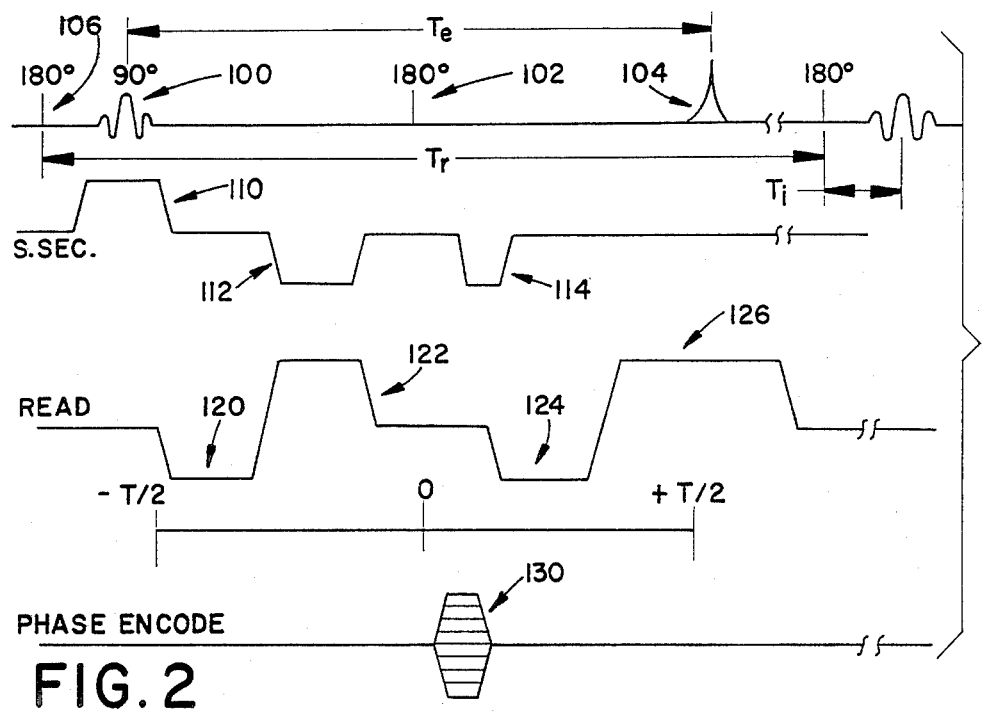
FIG. 2
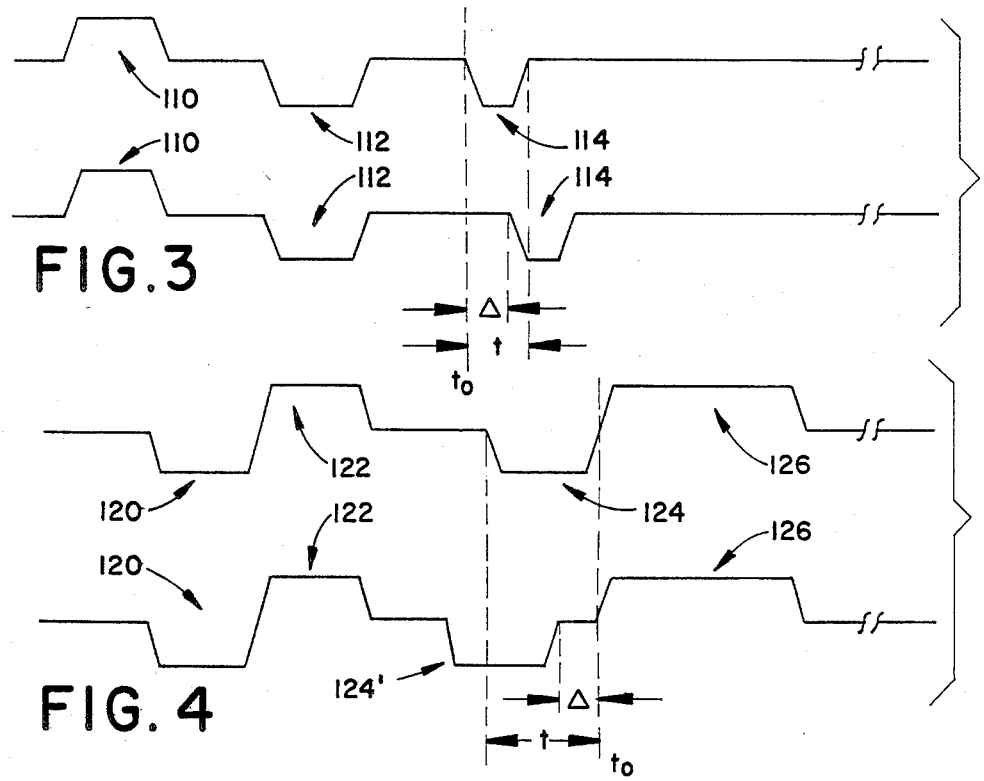
FIG. 3
FIG. 4

MAGNETIC RESONANCE IMAGING OF HIGH VELOCITY FLOWS

BACKGROUND OF THE INVENTION

The present invention relates to the art of magnetic resonance imaging of moving substances and velocity determination by phase mapping. It finds particular application in conjunction with measuring blood flow and will be described with particular reference thereto. However, it is to be appreciated that the invention is also applicable to imaging or phase mapping other anatomical fluid flows, non-biological fluids, multi-component systems in which one gaseous, fluid, semi-fluid, solid, or other component moves relative to other components, or the like.

Heretofore, it has been recognized that the spin-echo magnetic resonance imaging signal from material flowing through a field gradient experiences a phase shift. Because the phase shift varies linearly with velocity, the spin-echo imaging and phase mapping have been used to measure velocities of slow moving, uniform flows, including blood flows in vivo. However, varying flow rates cause corresponding variations in the phase shift which interferes with the phase encoding. These phase variations result in noise which extends from the blood vessel across the image in the phase encoding direction. This is particularly serious at high flow velocities at which there are frequently small velocity variations and eddy currents which cause significant phase shifts. This renders the prior art techniques unsuited to phase mapping high blood flow velocities such as major blood flows adjacent the heart. High blood flow rates of clinical interest occur in the coronary, carotid, and pulmonary arteries and the aorta.

Several techniques have been devised for phase mapping slower, relatively constant blood flows. In one such technique, the gradients are velocity encoded. The pixel phases are calculated on one image obtained using the velocity encoded gradients. See P. R. Moran, "A Flow Velocity Zeugmatographic Interlace for NMR Imaging in Humans," Magnetic Resonance Imaging, volume 1, pages 197–203, 1982. In another technique described in D. J. Bryant, J. A. Payne, D. N. Firmin, and D. B. Longmore, "Measurement of Flow with NMR Imaging Using a Gradient Pulse and Phase Difference Technique", in the Journal of Computer Assisted Tomography, volume 8, number 4, pages 588–593, 1984, two images are obtained. One is obtained with a standard sequence and the other is obtained with velocity encoded gradients. The phase difference between the two is then mapped. In a technique of T. W. Redpath, D. G. Norris, R. A. Jones, and J. S. Hutchison, "A New Method of NMR Flow Imaging", Phys. Med. Biol. volume 24, number 7, pages 891–898, 1984, the velocity information is extracted pixel by pixel. Several images, each with one of a plurality of encoded gradients, are collected. A Fourier transform is performed on the pixel phases to extract the velocity information.

Two-echo Carr-Purcell sequences have also been used to map blood flows. However, the Carr-Purcell sequences make no determination of the flow velocity. The second echo of the Carr-Purcell sequence refocuses the flow related phase shift information. That is, the flow related phase shift acquired by the material flowing in the read gradient direction on the first echo is refocused on the second echo. This refocusing provides increased intraluminal signal intensity with even-echo rephasing. See K. J. Packer, "The Study of Slow Coherent Molecular Motion by Pulsed Nuclear Magnetic Resonance", Molecular Physics, volume 17, number 4, pages 355–368, 1969 and V. Waluch and W. G. Bradley, "NMR Even Echo Rephasing in Slow Laminar Flow", Journal of Computer Assisted Tomography, volume 8, number 4, pages 594–598, 1984.

Conventional slice selection and frequency encoding both use spin or field gradient echoes. The phase shift at each pixel is dependent on the flow in both the read and the slice select direction. Although the relative phase shift at each pixel may be rendered sensitive to flow in only a single direction, the high sensitivity to flow velocity variations remains. Commonly, a phase shift of greater than 20 degrees for each centimeter per second of velocity change is experienced.

The velocity sensitivity has two adverse effects on the resultant image. First, magnetic resonance signals are phase dependent on the varying phase-encode field gradient. The two dimensional Fourier transform method of spatially mapping the magnetic resonance signals identifies signal components arising from different positions along the phase-encode gradient. As the gradient is incremented to collect a plurality of views, the signal arising from a given position changes in phase by an amount proportional to its position. Spatial resolution is improved by the Fourier transformation of the signals acquired over a plurality of views or increments of the phase encoded gradient, e.g. 256 views.

The phase dependence of the magnetic resonance signal on velocity introduces an extra term in the phase encoding process. When the velocity dependent phase term is constant from view to view, the extra term has no effect on the spatial resolution. However, when the velocity changes from view to view, such as from turbulence or minor irregularities in heart rate or ejection volume, the associated phase changes are interpreted as noise when decoding the spatial position of the resonance signal component. The available signal intensity is dispersed through the image in the phase encoding dimension or direction. This prevents signal phase, hence, velocity determination.

The second effect of the velocity sensitivity is a reduction in the signal intensity from vessels flowing in the read direction by phase cancellation through a flow profile. For example, laminar flow through a circular pipe lying within the selected slice has a flow profile which is parabolic. The maximum flow velocity is at the center of the pipe, while the flow velocity is zero at the boundary with the wall. When the pipe and the fluid flowing therein is imaged through a longitudinal slice, one resultant resonance signal represents the projection or integral of the signal components from columns of incremental volume elements extending across the pipe. The component from each incremental volume element has the same intensity but each has a phase which is proportional to the local velocity. Summing or projecting the phases in the column across the pipe sums components from incremental volume elements which have the generally parabolic range of velocities. This summation of signal components across the pipe leads to signal attenuation by phase cancellation. As the phase sensitivity to velocity increases, the phase cancellation becomes greater. In a typical spin-echo sequence which is imaging velocities in the read direction above 15 centimeters per second, attenuations of over 75% have been encountered. In actual measurement of blood flow, the attenuation is lower attributable to the non-Newtonian nature of blood. Blood travels through the body with a flow which approximates plug flow more closely than laminar flow.

Another disadvantage of spin-echo sequences for blood measurement arises from the use of a single 180 degree pulse within each cycle of the sequence. The 180 pulse generates the echo and refocuses the applied gradients as well as the static magnetic field inhomogeneity. If the refocusing pulse is slice selected, excited material flowing oblique to or perpendicular to the selected slice may move out of the selected slice in the time interval between application of the excitation and refocusing pulses. Hence, the excited material does not experience the refocusing pulse and severe signal loss is observed. However, this disadvantage may be overcome with broadband refocusing pulses which refocus excited material however it has moved since excitation.

However, broadband refocusing pulses introduce another problem in blood and other materials with relatively long relaxation times. Material outside the selected slice is subject to a series of the broadband refocusing pulses arising from repetition of the imaging sequence. This has the effect of inverting Z-magnetization at every repetition of the imaging sequence, typically at least every second. The inversion pulses then cause a progressive saturation of the material outside the slice until a semi-saturated steady state polarization is reached. When this material moves into the slice, it produces a signal proportional to this polarization. Partial saturation then produces a corresponding reduction in signal intensity. For example, when imaging blood with a 20 ms spin-echo sequence repeated every one second, the intensity is reduced approximately 45% relative to fully polarized blood.

The present invention contemplates a technique which overcomes the above referenced problems and others to map even high velocity and non-constant blood flows.

SUMMARY OF THE INVENTION

In accordance with one aspect of the present invention, a method is provided for magnetic resonance phase mapping of moving substances. A pre-inversion of magnetization is cause before application of a magnetic resonance exciting signal during an otherwise conventional spin-echo magnetic resonance sequence.

In accordance with another aspect of the present invention, a method is provided for magnetic resonance imaging. A resonance excitation pulse is applied. At least one of a first read gradient and a first slice selection gradient are applied. An inversion pulse is then applied to cause a spin-echo. Thereafter, at least one of a second read gradient and a second slice selection gradient is applied. The applied first and second gradients are configured and timed relative to each other such that the effective first moment in time is substantially zero. The resultant resonance signals are reconstructed into an image.

In accordance with a further aspect of the present invention, at least one of the second read and slice selection gradients are altered, e.g. time shifted, and the sequence is repeated to generate a second image.

In accordance with another aspect of the present invention, first and second phase maps are calculated from the ratio of the real and imaginary components of each pixel within the first and second images. The velocity at each pixel is calculated from the difference between the phases of the first and second phase maps.

In accordance with yet another aspect of the present invention, a magnetic resonance apparatus is provided. Magnets provide a substantially uniform main magnetic field. Gradient coils and controls are arranged to apply read and slice select gradients selectively across the main magnetic field. A resonance excitation control means causes an R.F. coil to apply resonance excitation pulses. An inversion pulse control means selectively causes the R.F. coil to apply broadband inversion pulses preceding application of the excitation pulse and subsequent to application of the excitation pulse. A receiving means is connected with the R.F. coil to receive magnetic resonance signals therefrom which are conveyed to an image reconstructing means for reconstructing a representation of an image of the selected slice. A first memory stores a representation of a first image generated with read and slice select gradients that are configured to cause a substantially zero effective first moment in time. A second memory stores a representation of a second image of the same slice generated with at least one of the read and slice select gradients altered to phase encode flow velocities. First and second phase calculation means calculate phase maps pixel by pixel, respectively, from the first and second image representations. A difference means subtractively combines the phase maps to provide a velocity phase map of the difference therebetween.

One advantage of the present invention is that it successfully phase maps high flow velocities.

Another advantage of the present invention is that it maps flows which include turbulence, beat variation, and other non-constant flow components.

Yet another advantage of the present invention is that it achieves high intraluminal signal intensity.

Still further advantages of the present invention will become apparent upon reading and understanding the following detailed description of the preferred embodiment.

BRIEF DESCRIPTION OF THE DRAWINGS

The invention may take form in various steps and arrangements of steps or in various components and arrangements of components. The drawings are only for purposes of illustrating a preferred embodiment and are not to be construed as limiting it.

FIG. 2 is a diagrammatic timing sequence for flow imaging incorporating a pre-resonance excitation inversion pulse and an even-echo rephasing by gradient echo formation;

FIG. 3 is a diagrammatic illustration of slice selection gradients for flow encoding; and, FIG. 4 illustration of read gradients for in-plane flow encoding.

DETAILED DESCRIPTION OF THE PREFERRED EMBODIMENT

Figure 1:
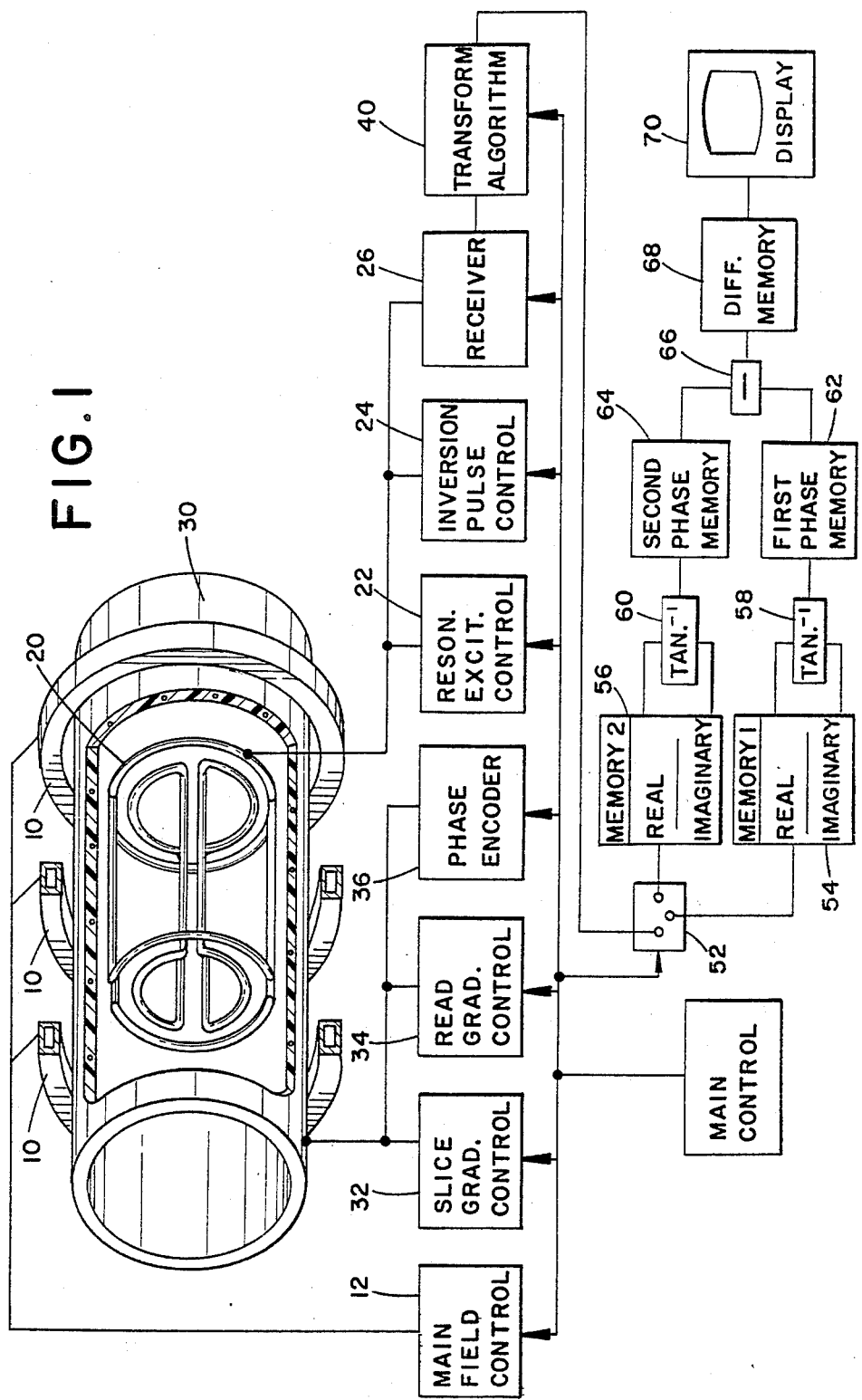
FIG. 1 is a diagrammatic illustration of a magnetic resonance apparatus in accordance with the present invention.

With reference to FIG. 1, a magnetic resonance imaging apparatus includes a plurality of magnetics 10 and a control circuit 12 therefore that generate a substantially uniform magnetic field linearly through an image region. A radio frequency (R.F.) coil 20 is connected with a resonance excitation control circuit or means 22 which selectively causes the R.F coil to transmit a resonance excitation pulse, such as a 90 degree pulse. An inversion pulse control circuit or means 24 selectively applies inversion pulses, such as broadband 180 degree pulses, for selectively inverting the spin of resonating nuclei. A radio frequency receiver 26 receives radio frequency resonance signal components generated by resonating nuclei in the image region. Separate transmit and receive coils may be provided or the R.F. coil 20 may function alternately as a transmitter and as a receiving antenna.

A gradient coil arrangement 30 includes the appropriate windings for causing gradients across the main magnetic field in the image region at selectable angles and with selectable durations and periodicity. A slice selection gradient control means or circuit 32 selectively applies electrical power to the gradient coil assembly to select a slice or plane in the image region to be phase mapped. Commonly, the slice is selected by applying a linear field gradient across the image region and applying a narrow band excitation pulse to excite spins over a limited range of resonance frequencies. A read gradient control 34 selectively applies a read gradient across the image region. A phase encoder or means 36 selectively adjusts the gradients so as to cause a phase shift which varies with spatial position such that the resonance signal is spatially encoded.

A transform means 40 transforms or maps discretely sampled values of the received resonance signal from a frequency domain to a spatial domain. In the preferred embodiment, a fast Fourier transform algorithm transforms or maps the received resonance signal components between domains.

A switching means 52 channels to a first memory 54 separate real and imaginary components of a first image representation of which the phase is substantially independent of flow velocity. Real and imaginary components of resonance data which are encoded with information on the moving portions of the object as discussed above are channelled by the switch means 52 into a second memory 56.

A first phase determining means 58 determines the phase at each pixel of the image of the first memory 54. In the preferred embodiment, the first phase determining means calculates the phase at each pixel from the arctangent of the ratio of corresponding real and imaginary pixel values. A second phase determining means 60 determines the phase of each pixel of the second memory 56, preferably from the arctangent of corresponding real and imaginary pixel values. First and second phase map memories 62 and 64 store phase maps corresponding to the phases at each pixel of the first and second images, respectively. A difference means 66 subtractively combines the corresponding pixels of the first and second phase maps to provide a velocity phase difference map for storage in corresponding pixels of a difference phase map memory 68. A video monitor 70 or other display means converts the velocity difference phase map from the difference memory 68 into a man-readable display, such as a video image in which pixel intensity varies with phase shift, hence, velocity. Optionally, the display means may produce other displays from the images, phase maps, and fuctions thereof.

FIG. 2 sets forth the preferred imaging sequence or actuation sequence for the control circuits of FIG. 1. By way of background, in a conventional Carr-Purcell imaging sequence, a 90 degree excitation pulse is followed by two 180 degree inversion pulses which, in turn, are followed by the collection of resonance data.

In the present invention, a 90 degree or other excitation pulse 100 is followed by a first inversion pulse 102 which is followed by collection of spin-echo data at 104. The elimination of the second inversion pulse from the Carr-Purcell technique reduces the imaging time and permits faster flows and motion to be phase mapped. However, the slow relaxation time of blood causes a signal reduction as the cycle repeat time, $T_r$, of the resonance sequence is reduced. To allow the sequence to be shortened without saturation, the magnetization is inverted before application of the excitation pulse 100 with a second inversion pulse 106. In the preferred embodiment, the first and second inversion pulses are both 180 degree broadband pulses.

Unlike the Carr-Purcell imaging sequence which perforce rephases the moving magnetizaton, the spin-echo sequence does not. In the present invention, magnetization from moving material is rephased by even-echo rephasing of both the slice select and the read gradients. More specifically, a slice select pulse of a first polarity 110 is applied during the application of the excitation pulse 100. Complementary slice select pulses 112, 114 of a second polarity are applied on either side of the first inversion pulse 102. The magnitude and duration of the complementary slice selection gradient pulses are selected such that the magnetization of moving material is rephased.

Analogously, the even-echo rephasing technique is applied to tailor the read gradient pulses to achieve rephasing of moving magnetization. In particular, a read gradient pulse of a first polarity 120 and a pulse of a second polarity 122 are applied prior to the inversion pulse 102. After the inversion pulse, a second first polarity read pulse 124 is applied followed by a second read gradient pulse of the second polarity 126 during the spin-echo 104. The timing and amplitude of the gradient pulses 120, 122, 124, and 126 are again selected to rephase the moving magnetization. One of a selected plurality of phases are encoded by phase encoding pulses 130.

With reference to FIGS. 3 and 4, the gradient pulse in the direction of the flow or flow component which is to be phase mapped is shifted to encode flow into the spin-echo. If only the slice selection gradient is shifted (FIG. 3), then the component of flow in the slice selection direction is measured. If only the read gradient is shifted (FIG. 4), then the flow component in the read direction is measured. If both the slice selection gradient and read gradient are shifted, then the flow component oblique to the slice selection and read directions is measured.

If the flow is oblique to either direction, shifting either pulse will reveal flow velocities, but only the absolute flow multiplied by its direction cosine. The oblique angle obtained by shifting both pulses is defined by the relative phase sensitivity of the two gradients. For example, shifts causing a twice the phase sensitivity to flow in the read direction to that in the slice selection direction will be most sensitive to flow angled 26 degrees (an arctangent of 0.5) from the read axis, and be insensitive to flow perpendicular to this direction.

In the preferred embodiment, the flow encoding is achieved by shifting the gradient pulse in time. Specifically, the second, second polarity slice selection gradient pulse 114 is time shifted or delayed by Δ to become a time shifted slice selection gradient pulse 114'. Analogously, the read gradient pulse 124 is time shifted or advanced by Δ to become a time shifted read gradient pulse 124'. Optionally, the gradient pulse may be amplitude shifted. Time shifting is preferred to amplitude shifting because at high electrical power, the gradient amplitude shift may be non-linear and because the very small time shifts can be accurately made. At least two gradient pulses are scaled, for example, gradients 120 and 122, as echoes occur when the zeroth moment (time integral) of the gradient vanishes. This is achieved with equal changes in two gradients.

Without the second inversion pulse 106, the steady state polarization of out-of-slice material immediately prior to application of the 90 degree excitation pulse may be expressed as:

$$\frac{M(z)_{ss}}{M(z)_e} = \frac{1 + \exp(-T_r/T_1) - 2\exp(-T/T_1)}{1 + \exp(-T_r/T_1)} \quad (1)$$

$T_1$ is the longitudinal relaxation time, $M(z)_{ss}$ is the steady state z component of magnetization, $M(z)_e$ is the equilibrium z component of magnetization, and $T_r$ is the cycle repeat time of the sequence.

By applying the second broadband inversion pulse 106 prior to the 90 degree excitation pulse, the material outside of the slice is subject to two inversions in quick succession. This improves the steady state response and provides a steady state polarization immediately preceding the excitation pulse 100 which may be expressed as:

$$\frac{M(z)_{ss}}{M(z)_e} = 1 - 2\exp(-T_i/T_1)\frac{1 - \exp(-T/T_1)}{1 - \exp(-T_r/T_1)} \quad (2)$$

where $T_i$ is the interval between the second inversion pulse 106 and the excitation pulse 100. It is this polarization which is converted into an observable signal by the ensuing excitation pulse when the flow trajectory carries the material into the imaging slice. It should be appreciated that the time $T_i$ between the inversion pulse and the excitation pulse may be varied to suppress body fat signals which have different $T_1$ longitudinal relaxation time constants.

The phase magnetization subjected to a varying magnetic field gradient may be defined as:

$$\phi(T_e) = \phi(0) + \int_0^{T_e} \gamma G(t)x(t)dt \quad (3)$$

where $\phi(T_e)$ is the phase of magnetization at time $T_e$, G(t) is the gradient strength time t, x(t) is the position of the magnetization packet at time t, and $\gamma$ is the gyromagnetic ratio. The effect on a packet of magnetization undergoing a general motion may be expressed by expanding x(t) as a power series in time differentials of position, as follows:

$$x(t) = x(0) + \sum_{i=1}^{\infty} \frac{t^i}{i!} x^{(i)}(0) \quad (4)$$

where $x^{(i)}(t)$ is the i'th differential. Neglecting the terms higher than i=1, the position and velocity dependence of in the phase shifts may be expressed as:

$$\phi(t_e) - \phi(0) = x(0)\int_0^{T_e} \gamma G(t)dt + x^{(1)}(0)\int_0^{T_e} \gamma G(t)t\,dt \quad (5)$$

The first inversion pulse 102 reverses the sign of the phase angle at the time of the pulse. This may be expressed mathematically be reversing the sign of the gradient G(t) after an odd number of inversion pulses. With this modification to the gradient strength, echoes occur from stationary magnetization when G(t) is modulated such that $\phi(T_e)$ is independent of position, i.e.:

$$\int_0^{T_e} G(t)dt = 0 \quad (6)$$

Using only a single echo, the velocity dependent term of Equation (5) does not cancel. This phase shift may be refocused by using a second echo, with the effective gradient profile inverted with respect to the first echo 104. This is achieved in the preferred embodiment by combining gradient and spin echoes. The even-echo rephasing effect is achieved by combining two gradient echoes 120, 122, and 124, 126, one on either side of the first inversion pulse 102.

Referring again to FIG. 2, the higher order components of motion described by Equation (4) are also rephased by the even-echo rephasing. By selecting the time origin at the center of the sequence, the analysis of the higher order terms becomes simple. The phase-shift due to a given component is now calculated in terms of a power expansion around the inversion pulse 102 defined origin as follows:

$$\phi\left(\frac{T}{2}\right) - \phi\left(\frac{T}{2}\right) = \sum_{i=0}^{\infty} \frac{x^{(i)}(0)}{i!} \int_{-T/2}^{T/2} \gamma G(t)t^i dt \quad (7)$$

Because the integral of Equation (7) is taken over equal ranges in positive and negative time, it vanishes when the integrand is an odd function of time. This occurs for all odd derivatives of position provided the gradient is an even function of time. The zeroth order term also vanishes. This leaves only the terms arising from even derivatives of position, that is, i=2, 4, 6, . . . .

The gradient profile is suitable for frequency encoding. Similar principles may be employed to rephase the shift arising from slice selection. A suitable profile is illustrated in FIG. 2.

Splitting the second echo about the inversion pulse dephases any inaccuracies in the inversion of z-magnetization. That is, any magnetization brought into the transverse plane by an inaccurate inversion of the z-magnetization is dephased across the slice thickness rather than being refocused by the frequency encode gradient into the center of the data collection window which would cause an artifact in the image.

The echo phenomenon produces a signal whose phase is dependent on flow velocity. This velocity dependent phase is incorporated in the slice select and the read gradient profiles as outlined above.

To compensate for residual errors in rephasing, a difference technique is employed. That is, the phase difference is taken between two images, one obtained with velocity dependent phase and the other without. Because the slice select and read gradient pulses are already present, the data for the first and second images may be obtained by time shifting one or more of the gradients by an amount $\Delta$. Excluding terms common to both images, the phase difference between the images may be represented as:

$$\Delta \phi = \int_{t_o}^{t_o + t} \gamma G(t) \{x(t) - x(t + \Delta)\} dt \quad (8)$$

If the positional displacement of magnetization between the two sequences is constant, $\Delta x$, over the time scale of the gradient pulse, the phase reduces to:

$$\Delta \phi = \Delta x \int_{t_o}^{t_o + t} \gamma G(t) dt \quad (9)$$

The average velocity can be uniquely calculated from the phase angle. Specifically, the velocity varies in proportion to the difference in arctangents of the ratio between the real and imaginary values of the first and second image representations. The sensitivity of the measurement is adjusted by changing the time shift parameter $\Delta$. The positional displacement is a product of the average velocity and the time shift parameter, that is:

$$\Delta x = v \cdot \Delta \quad (10)$$

For typical arterial flow measurements in the slice select direction, gradient pulses of approximately one kilohertz per centimeter held for 4 milliseconds can code velocities up to one meter per second when time shifted by 1.25 milliseconds. For flow in the read direction, the read gradients are shifted analogously. Concurrent encoding in both the read and slice select directions may be achieved analogously or shifting or scaling the amplitudes of both gradients.

The invention has been described with reference to the preferred embodiment. Obviously, modifications and alterations will occur to others upon reading and understanding the preceding detailed description of the preferred embodiment. It is intended that the invention be construed as including all such alterations and modifications in so far as they come within the scope of the appended claims or the equivalents thereof.

Having thus described the preferred embodiment, the invention is now claimed to be:

1. A method of magnetic resonance imaging of moving substances, the method comprising;
   (a) applying a first broadband 180 degree inversion pulse;
   (b) applying a 90 degree resonance excitation pulse and a first slice selection gradient;
   (c) applying a first read gradient;
   (d) applying a second broadband 180 degree inversion pulse;
   (e) applying second, complementary read and slice selection gradients which substantially zero the effective first moment in time;
   (f) applying phase encoding gradients;
   (g) receiving a magnetic resonance signal; and,
   (h) reconstructing an image from the resonance signal.

2. The method as set forth in claim 1 further including cyclically repeating steps (a) through (g).

3. The method as set forth in claim 2 further including repeating steps (a) through (h) with an amplitude of at least one of the read and slice selection gradients altered.

4. The method as set forth in claim 2 further including repeating steps (a) through (h) with at least one of the read and slice selection gradients time shifted to reconstruct a second image.

5. The method as set forth in claim 4 wherein the first and second images each include a real and an imaginary image value for each of a plurality of corresponding pixels.

6. The method as set forth in claim 5 further including the step of determining first and second phase maps at each pixel of the first and second images from a ratio of the real and imaginary values of corresponding pixels.

7. The method as set forth in claim 6 further including the steps of determining a difference phase map by subtractively combining corresponding pixels of the first and second phase maps.

8. The method as set forth in claim 7 further including the step of adjusting at least one of the slice selection and the read time shifts to adjust a proportionality between resultant phase shifts and slice selection and read gradient direction velocity components, respectively.

9. A method of magnetic resonance imaging comprising:
   (a) applying a resonance excitation pulse and a first slice selection gradient;
   (b) applying a first read gradient;
   (c) applying an inversion pulse to cause a spin-echo;
   (d) applying a second read gradient after the inversion pulse, the first and second read gradients being sized and timed relative to each other such that an effective first moment in time is substantially zero;
   (e) transforming received resonance signals into an image representation.

10. The method as set forth in claim 9 wherein the first and second read gradients are substantially the same, such that odd derivatives of position cancel, whereby the first and second read gradients produce even-echo rephasing.

11. The method as set forth in claim 10 further including the steps of applying a pair of complimentary slice selection gradients before and after the inversion pulse to reduce sensitivity to flow in a selected slice plane.

12. The method as set forth in claim 9 further including the step of applying an inversion pulse immediately preceding the resonance excitation pulse.

13. The method as set forth in claim 9 further including repeating steps (a) through (e) with at least one of the read gradient altered to obtain a second image representation.

14. The method as set forth in claim 13 further including calculating phase maps from real and imaginary components of the first and second images and subtractively combining the phase maps.

15. A method of magnetic resonance imaging comprising:
   (a) applying a resonance excitation pulse;
   (b) applying a first slice selection gradient;
   (c) applying an inversion pulse;
   (d) applying a second slice selection gradient, the first and second slice selection gradients being sized and timed relative to each other such that an effective first moment in time is substantially zero;
   (e) applying a read gradient and reconstructing an image from received resonance signals.

16. The method as set forth in claim 15 further including repeating steps (a) through (e) with the second slice selection gradient altered.

17. The method as set forth in claim 15 further including the step of applying a spin inversion pulse preceding the step of applying the resonance excitation pulse.

18. A method of magnetic resonance examination of moving substances in an image region, the method comprising:
- acquiring a first magnetic resonance image having real and imaginary components with a first gradient profile applied to the image region;
- acquiring a second magnetic resonance image having real and imaginary components with the first gradient profile applied time shifted to the image region such that phases of the moving substances in the image region are affected selectively;
- creating a first phase map from the real and imaginary components of the first image;
- creating a second phase map from the real and imaginary components of the second image; and,
- correcting for any stationary phase artifacts by taking a difference between the first and second phase maps.

19. A magnetic resonance apparatus for examining moving substances, the apparatus comprising:
- a main magnetic field control means for generating a generally uniform magnetic field through an image region;
- at least one coil for transmitting and receiving radio frequency signals, the coil being disposed adjacent the image region;
- a resonance excitation control means for selectively causing the coil to transmit a resonance excitation pulse;
- an inversion pulse control means for selectively causing the coil to transmit a spin inversion pulse;
- a receiving means for receiving a radio frequency resonance signal received by from the coil;
- a gradient coil means for selectively causing magnetic field gradients across the main magnetic field;
- a slice selection gradient means for selectively causing the gradient coil means to generate gradients for selecting a slice through the image region to be imaged;
- a read gradient control means for selectively causing the gradient coil means to generate a read gradient across the slice;
- a phase encoder means for selectively causing the gradient coil means to phase encode resonating nuclei in the selected slice;
- a transform means for selectively transforming the resonance signal from the receiving means into an image representation which has real and imaginary values corresponding to each of a plurality of pixels;
- a first memory means for storing real and imaginary portions of a first image representation which is produced when the slice selection gradient control means and the read gradient control means apply slice selection and read gradients in such a manner that an effective first moment in time in the selected slice is substantially zero;
- a second memory means for storing real and imaginary portions of a second image representation which is produced when at least one of the slice selection gradient control means and the read gradient control means flow encodes resonating nuclei in the selected slice by shifting at least one of the respective slice selection and read gradients;
- a phase determining means for determining a phase map whose intensity values vary with phase shift, the phase determining means being operatively connected with the first and second memory means for determining at least first and second phase maps from the first and second images;
- a first and second phase map memory means for storing the first and second phase maps, the phase map memory means being operatively connected with the velocity determining means, and;
- a difference means for substractively combining the first and second phase maps to correct for any stationary artifacts the difference means being operatively connected with the first and second phase map memory means.

20. A spin-echo magnetic resonance method for imaging flowing substances in a selected slice, the method comprising:
(a) initially inverting a magnetization of selected dipoles of flowing and stationary substances inside and outside of the selected slice;
(b) exciting magnetic resonance of the dipoles of the flowing and stationary substances in the selected slice only;
(c) inverting the magnetization of the flowing and stationary substances inside and outside of the selected slices such that the dipoles of the substances outside of the selected slice during the magnetic resonance excitation are subject to two complimentary magnetization inversions and such that a spin echo is induced from the dipoles in which magnetic resonance was excited while in the selected slice;
(d) applying a phase encode gradient;
(e) during the spin echo, applying a read gradient and receiving magnetic resonance signals generated by the dipoles in which magnetic resonance was excited and which are inside and outside of the selected slice;
(f) applying at least one additional gradient after exciting magnetic resonance and before the spin echo which additional gradient rephases the magnetization of resonating dipoles of components of the substance flowing perpendicular to the gradient relative to the magnetization of the resonating dipoles of the stationary substances and other components of the flowing substance, whereby the received magnetic resonance signals from a selected component of the flowing substance is distinguished by relative phase.

21. The method as set forth in claim 20 further including correcting for phase artifacts by repeating steps (a) through (f) with the additional gradient altered to cause a different rephasing of the magnetization of the resonating dipoles of the flow component perpendicular to the gradient and combining components of the magnetic resonance signals received in sequences with the additional and altered addition gradients.

22. The method as set forth in claim 20 wherein the initial inversion of magnetization in step (a) includes applying a broadband inversion pulse.

* * * * *